(12) United States Patent
Bao et al.

(10) Patent No.: US 10,002,759 B2
(45) Date of Patent: Jun. 19, 2018

(54) METHOD OF FORMING STRUCTURES WITH V SHAPED BOTTOM ON SILICON SUBSTRATE

(71) Applicant: Applied Materials, Inc., Santa Clara, CA (US)

(72) Inventors: Xinyu Bao, Fremont, CA (US); Chun Yan, San Jose, CA (US); Errol Antonio C. Sanchez, Tracy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1 day.

(21) Appl. No.: 15/417,556

(22) Filed: Jan. 27, 2017

(65) Prior Publication Data

US 2018/0033621 A1    Feb. 1, 2018

Related U.S. Application Data

(60) Provisional application No. 62/366,914, filed on Jul. 26, 2016.

(51) Int. Cl.
*H01L 21/02* (2006.01)
*H01L 21/311* (2006.01)

(52) U.S. Cl.
CPC .... *H01L 21/02513* (2013.01); *H01L 21/0245* (2013.01); *H01L 21/02381* (2013.01); *H01L 21/02516* (2013.01); *H01L 21/02639* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 2011/0210374 A1* | 9/2011 | Lochtefeld | H01L 29/66795 257/190 |
| 2014/0027860 A1* | 1/2014 | Glass | H01L 21/823807 257/401 |
| 2014/0264725 A1 | 9/2014 | Chuang et al. | |
| 2014/0319615 A1 | 10/2014 | Chi et al. | |
| 2014/0357049 A1* | 12/2014 | Wu | H01L 29/66795 438/429 |
| 2015/0279975 A1 | 10/2015 | Hsiao et al. | |
| 2015/0311292 A1 | 10/2015 | Srinivasan et al. | |
| 2015/0380527 A1 | 12/2015 | Lee et al. | |
| 2016/0218104 A1* | 7/2016 | Wen | H01L 21/845 |
| 2016/0284848 A1 | 9/2016 | Lee et al. | |
| 2016/0365416 A1* | 12/2016 | Metz | H01L 29/66522 |
| 2018/0033872 A1* | 2/2018 | Bao | H01L 29/66795 |

* cited by examiner

*Primary Examiner* — Angel Roman
(74) *Attorney, Agent, or Firm* — Patterson + Sheridan LLP (57) ABSTRACT

The present disclosure generally relate to methods of processing a substrate in an epitaxy chamber. The method includes applying a passivating agent containing antimony to portions of a silicon substrate exposed through trenches formed in a dielectric layer on the silicon substrate, while applying the passivating agent containing antimony, exposing the silicon substrate to a group IV-containing precursor to form an epitaxial layer having a V-shaped structure having an exposed (111) plane at a bottom of the trenches, and forming a semiconductor layer on the epitaxial layer.

19 Claims, 4 Drawing Sheets

METHOD OF FORMING STRUCTURES WITH V SHAPED BOTTOM ON SILICON SUBSTRATE

CROSS-REFERENCE TO RELATED APPLICATIONS

This application claims priority to U.S. provisional patent application Ser. No. 62/366,914, filed Jul. 26, 2016, which is herein incorporated by reference.

FIELD

Implementations of the disclosure generally relate to the field of semiconductor manufacturing processes, and more particularly to methods for forming transistors.

BACKGROUND

As circuit densities increase for next generation devices, the widths of interconnects, such as vias, trenches, contacts, gate structures and other features, as well as the dielectric materials therebetween, decrease to 22 nm or smaller dimensions, while the thickness of the dielectric layers remain substantially constant, with the result of increasing the aspect ratios of the features. Recently, complementary metal oxide semiconductor (CMOS) FinFET devices have been introduced into many logic and other applications and are integrated into various different types of semiconductor devices.

FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

For epitaxial growth in narrow trenches, it is critical to trap the defects near the bottom of the trenches. The traditional flat bottom is (100) surface. The defect such as stacking faults and thread dislocations, especially for material such as GaAs or GaN, the antiphase boundary can propagate to the top portion of the semiconductor fins. The defects can cause device leakage and low performance.

Therefore, there is a need for an improved method to grow epitaxial materials in narrow trenches without having defects presented at the top portion of the semiconductor fins.

SUMMARY

The present disclosure generally relate to methods of processing a substrate in an epitaxy chamber. In one implementation, a method includes applying a passivating agent containing antimony to portions of a silicon substrate exposed through trenches formed in a dielectric layer on the silicon substrate, while applying the passivating agent containing antimony, exposing the silicon substrate to a group IV-containing precursor to form an epitaxial layer having a V-shaped structure having an exposed (111) plane at a bottom of the trenches, and forming a semiconductor layer on the epitaxial layer.

In another implementation, a method includes forming a dielectric layer on a substrate, etching the dielectric layer to form a trench, wherein the trench has a bottom surface exposing a portion of the substrate, exposing the bottom surface to a passivating agent containing antimony, exposing the bottom surface to a material forming precursor to form an epitaxial layer on the bottom surface, wherein the epitaxial layer has a V-shaped structure having an exposed (111) plane, and forming a semiconductor layer on the epitaxial layer.

In yet another implementation, a method includes applying a passivating agent containing antimony to portions of a silicon substrate exposed through trenches formed in a dielectric layer on the silicon substrate, exposing the portions of the silicon substrate to a material forming precursor to form an epitaxial layer having a V-shaped structure having an exposed (111) plane at a bottom of the trenches, wherein the passivating agent containing antimony is introduced into the processing chamber before the introduction of the material forming precursor such that growth rate of the epitaxial layer on $\{111\}$ planes of the exposed portion of the silicon substrate is faster than growth rate of the epitaxial layer on $\{100\}$ planes of the exposed portion of the silicon substrate, and forming a semiconductor layer on the epitaxial layer.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

Figure 1:
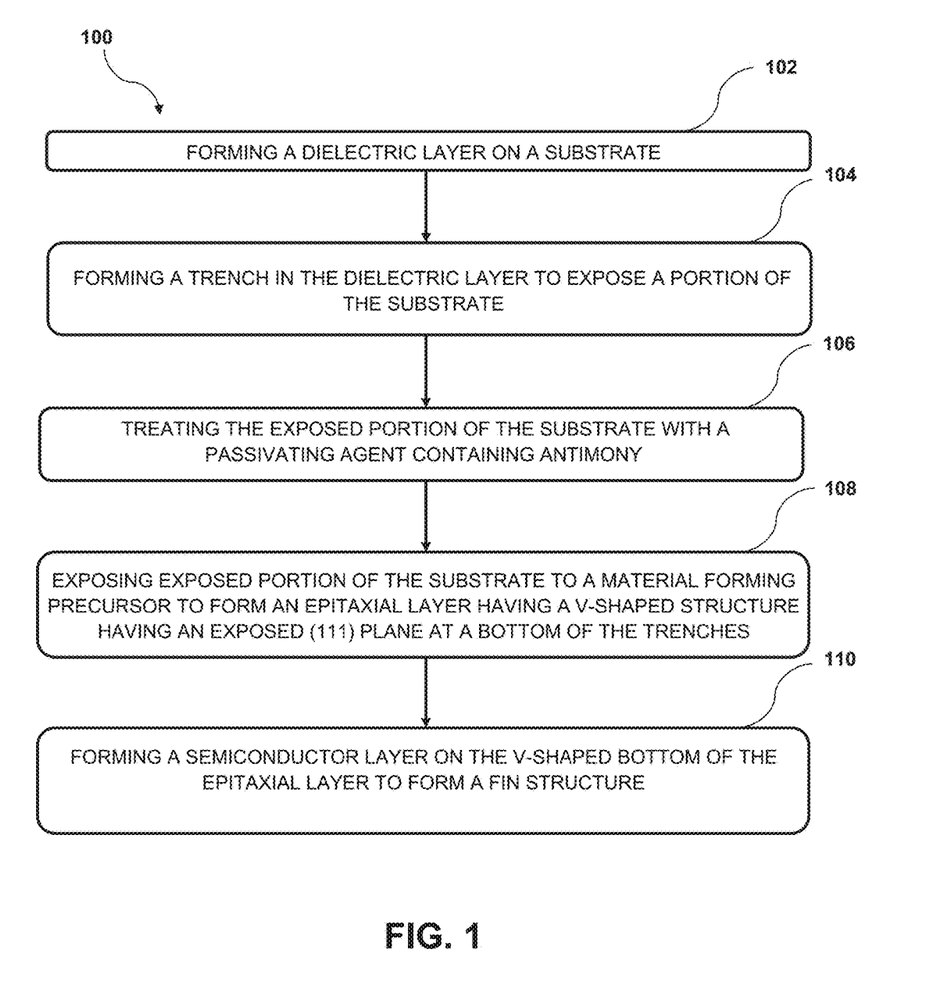
FIG. 1 is a flow chart illustrating an exemplary method for manufacturing semiconductor structure according to implementations of the disclosure.

FIG. 1 is a flow chart illustrating an exemplary method for manufacturing semiconductor structure according to implementations of the disclosure. FIGS. 2A to 2D illustrate cross-sectional views of a simplified semiconductor structure during certain stages of fabrication according to the flow chart of FIG. 1. Those skilled in the art will further recognize that the full process for forming a semiconductor device and the associated structures are not illustrated in the drawings or described herein. Instead, for simplicity and clarity, only so much of a process for forming a semiconductor device and the associated structures as is unique to the present disclosure or necessary for an understanding of the present disclosure is depicted and described. In addition, although various steps are illustrated in the drawings and described herein, no limitation regarding the order of such steps or the presence or absence of intervening steps is implied. Blocks depicted or described as sequential are, unless explicitly specified, merely done so for purposes of explanation without precluding the possibility that the respective steps are actually performed in concurrent or overlapping manner, at least partially if not entirely.

Figure 2A:
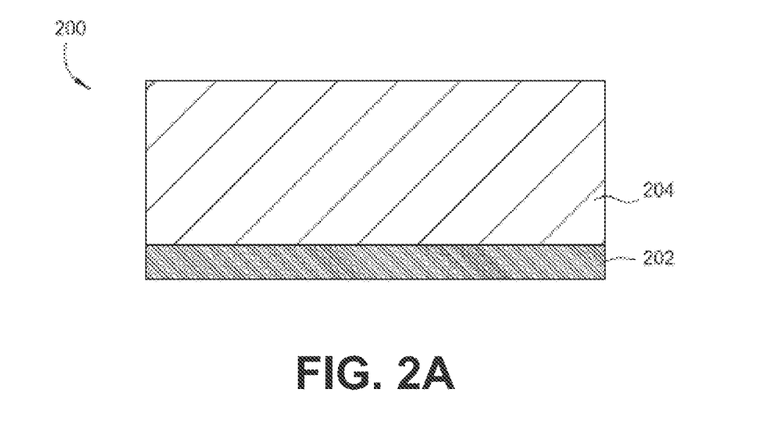
FIGS. 2A to 2D illustrate cross-sectional views of a simplified semiconductor structure during certain stages of fabrication according to the flow chart of FIG. 1.

The method 100 begins at block 102 by forming a dielectric layer 204 on a substrate 202, as shown in FIG. 2A. The term "substrate" used herein is intended to broadly cover any object that can be processed in a process chamber. For example, the substrate 202 may be any substrate capable of having material deposited thereon, such as a silicon substrate, for example silicon (doped or undoped), crystalline silicon (e.g., Si<100> or Si<111>), silicon oxide, strained silicon, doped or undoped polysilicon, or the like, germanium, a III-V compound substrate, a silicon germanium (SiGe) substrate, a silicon germanium carbide (SiGeC) substrate, a silicon germanium oxide (SiGeO) substrate, a silicon germanium oxynitride (SiGeON) substrate, a silicon carbide (SiC) substrate, a silicon carbonitride (SiCN) substrate, a silicon carbonoxide (SiCO), an epi substrate, a silicon-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, a patterned or non-patterned semiconductor wafer, glass, sapphire, or any other materials such as metals, metal alloys, and other conductive materials. In one exemplary implementation, the substrate 202 is a monocrystalline silicon substrate.

The dielectric layer 204 may be deposited using any suitable deposition process, such as a chemical vapor deposition (CVD) process, which may be plasma enhanced. The dielectric layer 204 may be a shallow trench isolation (STI) oxide, which may include silicon oxide (SiO), silicon dioxide ($SiO_2$), silicon nitride (SiN), silicon carbonitride (SICN), silicon oxynitride (SiON), aluminum oxide, or other suitable dielectric materials or high-k dielectric materials.

Figure 2B:
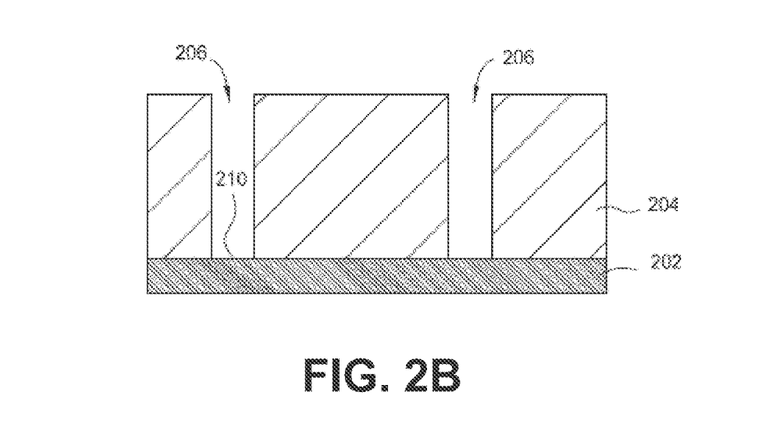

At block 104, the dielectric layer 204 is etched to form a trench 206. As shown in FIG. 2B, a plurality of trenches 206 may be formed in the dielectric layer 204. In one implementation, the trenches 206 are etched to expose a portion of the substrate 202. In such a case, the resulting trenches 206 may have sidewalls 208 comprising the dielectric layer 204 and a bottom surface 210 that is the exposed substrate 202 comprising silicon. The bottom surface 210 (i.e., the exposed substrate 202) may serve as a regrowth region for an epitaxial layer in a subsequent stage. The trenches 206 may be formed by patterning the dielectric layer 204 using any suitable etching process, such as anisotropic dry etching or wet etching process. The trenches 206 may be optionally cleaned.

The trenches 206 may have a high aspect ratio. The ratio of trench height to trench width (i.e., the aspect ratio) may be greater than 20 to 1, 18 to 1, 16 to 1, 14 to 1, 12 to 1, 10 to 1, 9 to 1, 8 to 1, 7 to 1, 6 to 1, 5 to 1, 4 to 1, 3 to 1, or 2 to 1, for instance. The trenches 206 may have a generally rectangular cross-section as shown or a cross-section with some other shape. The trenches 206 may have a generally constant cross-sectional profile along at least a portion of its length, such as through one, two, four, or more transistor lengths. In various implementations, the trenches 206 may have a width of about 5 nm to about 500 nm, a depth of about 30 nm to about 2000 nm, a length of about 20 nm to about 10 μm.

At block 106, the bottom surface 210 (i.e., the exposed substrate 202) of the trenches 206 is treated with a passivating agent containing antimony. As will be discussed in more detail at block 108 below, the present inventors have discovered that antimony (Sb) can be used as an effective surfactant before and/or during an epitaxy process for changing the growth rate on different crystal planes so that a subsequent epitaxial layer 212 is formed with an exposed (111) plane by epitaxial deposition, creating a V-shaped structure at the bottom of the trenches 206, as shown in FIG. 2C.

The passivating agent containing antimony may be any suitable antimony-containing precursors such as non-carbon antimony source gases or carbon-containing antimony source gases. The use of carbon-containing antimony source gases adds additional carbon to the epitaxial film to provide additional stress or diffusion block. In various implementations, the antimony-containing precursor may include stibine ($SbH_3$), antimony trichloride ($SbCl_3$), antimony tetrachloride ($SbCl_4$), antimony pentachloride ($SbCl_5$), triphenylantimony (($C_6H_5)_3Sb$), antimony trihydide ($SbH_3$), antimonytrioxide ($Sb_2O_3$), antimony pentoxide ($Sb_2O_5$), antimony trifluoride ($SbF_3$), antimony tribromide ($SbBr_3$), antimonytriiodide ($SbI_3$), antimony pentafluoride ($SbF_5$), Triethyl antimony (TESb) and trimethyl antimony (TMSb).

Figure 2C:
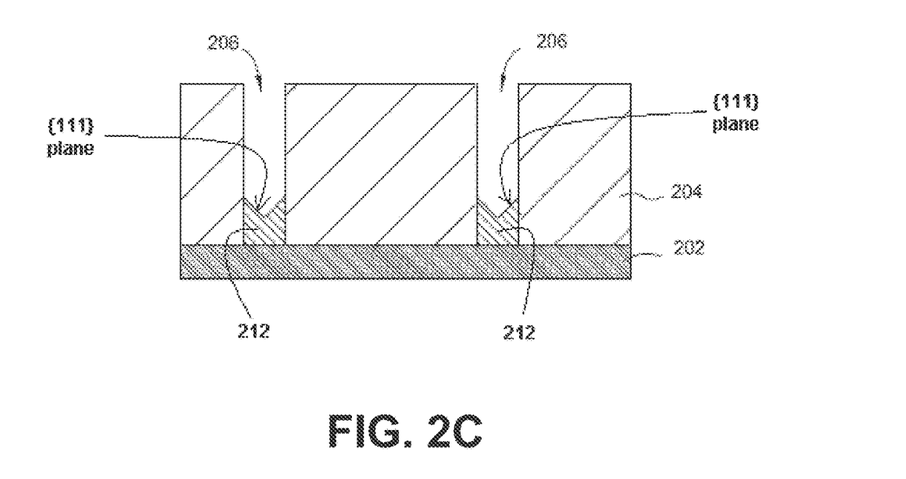

At block 108, the trenches 206 are exposed to a material forming precursor to form an epitaxial layer 212 on the bottom surface 210 within the trenches 206, as shown in FIG. 2C. The epitaxial layer 212 may be grown epitaxially from the bottom surface 210 away from the substrate 202. The epitaxial layer 212 may include any suitable semiconductor materials, for example doped or undoped group IV-containing material, compound semiconductor materials such as III-V materials, or any suitable materials that may be used to improve transistor performance. In one implementation, the epitaxial layer 212 is silicon. In another implementation, the epitaxial layer 212 is silicon germanium (SiGe). In some applications where high concentration of germanium is required, the concentration of germanium in the silicon may be above about 30% or more, for example about 45% or more, such as about 70% to about 100%.

In one implementation where the epitaxial layer 212 includes silicon, the material forming precursor may be a group IV-containing precursor such as a silicon-containing precursor. Suitable silicon-containing precursors may be non-carbon silicon source gases or carbon-containing silicon source gases. For example, the silicon-containing precursors may be silanes, halogenated silanes, organosilanes, or any combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), or other higher order silanes such as polychlorosilane. Halogenated silanes may include compounds with the empirical formula $X'_y Si_x H_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes may include compounds with the empirical formula $R_y Si_x H_{(2x+2-y)}$, where R=methyl, ethyl, propyl or butyl, such as methylsilane (($CH_3)SiH_3$), dimethylsilane (($CH_3)_2SiH_2$), ethylsilane (($CH_3CH_2)SiH_3$), methyldisilane (($CH_3)Si_2H_5$), dimethyldisilane (($CH_3)_2Si_2H_4$) and hexamethyldisilane (($CH_3)_6Si_2$).

If desired, one or more dopant gases may be introduced into the processing chamber to provide the epitaxial layer with desired conductive characteristic and various electric characteristics, such as directional electron flow in a controlled and desired pathway required by the electronic device. Exemplary dopant gas may include, but are not limited to phosphorous, boron, gallium, or aluminum, depending upon the desired conductive characteristic of the deposited epitaxial layer.

While the present disclosure uses silicon as an example for the epitaxial layer, it is contemplated that the concept described in implementations of the present disclosure is also applicable to other materials which may include, but are not limited to Si:P, SiC, SiAs, SiGeAs, Ge, GeP, SiGeP, SiGe:B, Si:CP, GeSn, GeP, GeB, or GeSnB. If a germanium-containing layer is desired, a gas mixture comprising a germanium-containing precursor may be introduced into the processing chamber. The gas mixture may further contain the silicon-containing precursor and the antimony-containing precursor discussed above. Suitable germanium-containing precursor may include, but is not limited to germane ($GeH_4$), digermane ($Ge_2H_6$), trigermane ($Ge_3H_8$), chlorinated germane gas such as germanium tetrachloride ($GeCl_4$), dichlorogermane ($GeH_2Cl_2$), trichlorogermane ($GeHCl_3$), hexachloro-digermane ($Ge_2Cl_6$), or a combination of any two or more thereof. Any suitable halogenated germanium compounds may also be used. In one exemplary implementation, digermane ($Ge_2H_6$) is used.

Any one or more of the antimony-containing precursors discussed at block 106 above may be co-flowed into the epitaxy chamber with the material forming precursor, which can be any one or more of the silicon-containing precursors discussed above. In some implementations, the antimony-containing precursor may be the same as the passivating agent containing antimony used at block 106. That is, the antimony-containing precursor used to treat or passivate the bottom surface 210 may remain on while flowing the silicon-containing precursor into the epitaxy chamber. Therefore, the antimony-containing precursor may be flowed continuously throughout the entire epitaxy process, or flowed a certain period of time at certain stages before or during the epitaxy process.

Figure 3A:
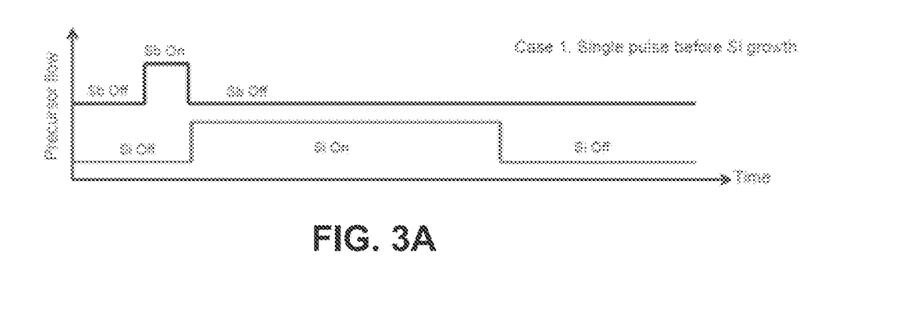
FIGS. 3A to 3C illustrate different flow schemes for forming an epitaxial layer according to implementations of the present disclosure.

In one implementation, a single pulse of the antimony-containing precursor (for passivating the bottom surface 210 of the trenches 206) may be introduced into the epitaxy chamber before the introduction of the silicon-containing precursor (i.e., before Si growth). The antimony-containing precursor may be discontinued once the silicon-containing precursor has introduced into the epitaxy chamber, as shown in FIG. 3A.

Figure 3B:
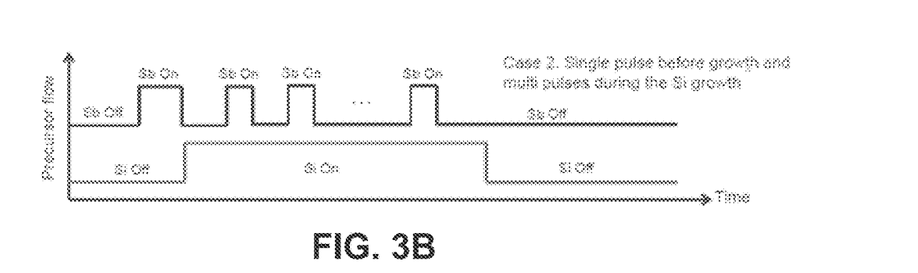

In some implementations, a single pulse of the antimony-containing precursor (for passivating the bottom surface 210 of the trenches 206) may be introduced into the epitaxy chamber before the introduction of the silicon-containing precursor (i.e., before Si growth). Once the silicon-containing precursor has been introduced into the epitaxy chamber (i.e., during Si growth), multiple pulses of the antimony-containing precursor may be introduced into the epitaxy chamber at predetermined time intervals, as shown in FIG. 3B. The multiple pulse of the antimony-containing precursor may be discontinued prior to discontinuing the silicon-containing precursor.

Figure 3C:
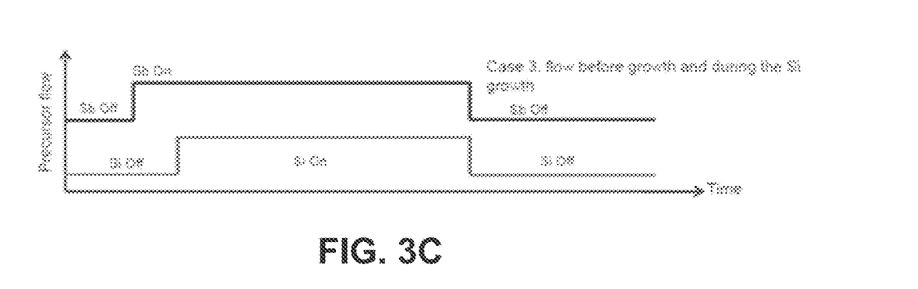

In some implementations, the antimony-containing precursor (for passivating the bottom surface 210 of the trenches 206) may be introduced into the epitaxy chamber before the introduction of the silicon-containing precursor (i.e., before Si growth). While flowing of the antimony-containing precursor, the silicon-containing precursor is introduced into the epitaxy chamber. The antimony-containing precursor and the silicon-containing precursor may be both discontinued once the desired thickness or shape of the epitaxial film has obtained.

In any of the flow scheme discussed herein, the input Sb/Si molar ratio may be about 0.0001 to about 10, for example about 0.001 to about 5, such as about 0.01 to about 1. During the epitaxy process, the temperature within the epitaxy chamber may be maintained at about 250 degrees Celsius to about 800 degrees Celsius, for example about 300 degrees Celsius to about 650 degrees Celsius, such as about 450 degrees Celsius to about 525 degrees Celsius. The pressure within the epitaxy chamber may be maintained at about 1 Torr or greater, for example, about 10 Torr to about 40 Torr or greater, such as about 150 Torr to about 600 Torr. It is contemplated that pressures greater than about 600 Torr may be utilized when low pressure deposition chambers are not employed.

In one implementation where the epitaxial layer 212 includes silicon, the substrate 202 or at least the trenches 206 is exposed to the silicon-containing precursor and the antimony-containing precursor. The antimony-containing precursor introduced at block 106 passivates the bottom surface 210, which is the exposed silicon substrate that may have (100) plane, (111) plane, and (110) plane. Without being limited to any specific theory, it is believed that Sb atoms from the antimony-containing precursor will react with the surface atoms (e.g., silicon atoms) of exposed substrate surface to form a barrier layer of Sb—Si bonds. This barrier layer of Sb—Si bonds changes the surface energy of the exposed substrate surface. When the subsequent precursors (e.g., the silicon-containing precursor) come into contact with the surface atoms, the growth atoms (i.e., silicon atoms from the silicon-containing precursor) will break the Sb—Si bonds on the (111) and (110) planes and bond with the silicon atoms exposed at the substrate surface to form Si—Si bonds at a faster rate than braking the Sb—Si bonds on the (100) planes. It is believed that the higher areal atomic density of the (111) and (110) planes, and the lower atomic bond strength in those planes, contributes to higher deposition rate along those planes than along the (100) plane. This reaction mechanism will result in faster epitaxial silicon growth along the <111> direction, while the epitaxial silicon growth on along <110> and <100> directions is slower. With the presence of Sb before and/or during epitaxial growth of silicon, the {111} planes will have the fastest growth rate compared to the {110} planes and {100} planes, while the {100} planes are found to have the slowest growth rate for the epitaxial silicon films. Since the epitaxial silicon growth rate along <111> directions are faster than <110> and <100> directions, the epitaxial silicon will grow into a V-shaped structure having an exposed (111) plane at the bottom of the trenches 206. It should be understood by those skilled in the art that the plane, direction, and family of the planes/directions used in this disclosure generally follow Miller notation system. For example, plane (100), plane (010), plane (001) belong to a family of {100} planes, and cubic edge directions [100], [010], [001], [0$\bar{1}$0], [00$\bar{1}$], [$\bar{1}$00] belong to a family of <100> directions.

In various implementations, the growth rate difference between {111} planes and {100} planes could be as large as about 20% or more, about 30% or more, about 40% or more, about 50% or more, about 60% or more, about 70% or more, about 80% or more, or about 90% or more, such as about 95%. The slower growth rate {100} planes will be disappeared after a certain period of time.

Having the epitaxial layer grown into a V-shaped faceting a (111) plane at the bottom of the trenches 206 can help confine the crystal defects to the bottom of the trenches 206 because the V-shaped bottom changes the defect propagating angle from <100> direction to <111> direction. Since crystal defects such as stacking faults or thread dislocations are terminated at the bottom of the V or at the trench sidewall and no defects are propagating towards the upper portion of the trenches 206, any subsequent material formed on the V-shaped bottom will be defect free. In addition, the processes performed at blocks 106 and 108 may be in-situ. Therefore, any silicon surface oxidation and contamination are avoided or minimized.

In some implementations, an optional thin silicon layer (about 1 nm to about 10 nm) may be formed on the V-shaped bottom. The thin silicon layer serves as an isolation for further epitaxial growth of subsequent materials.

Figure 2D:
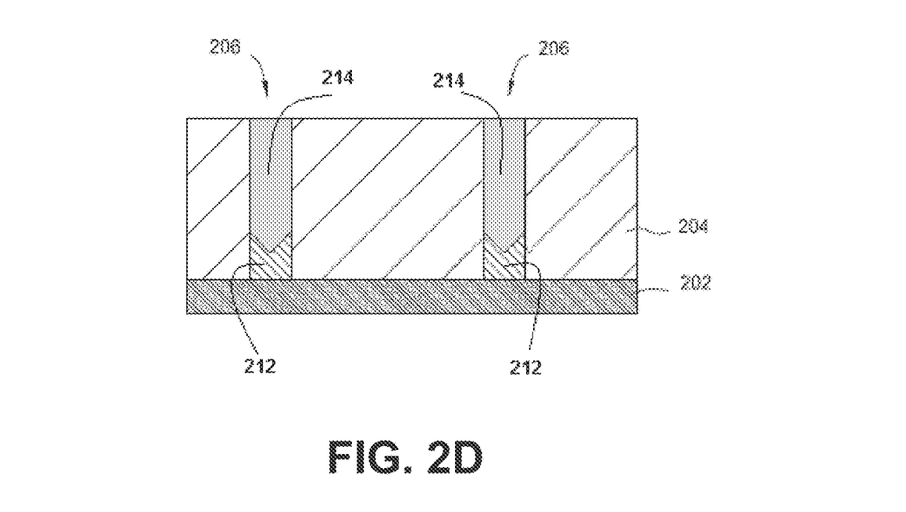

At block 110, a semiconductor layer 214 is formed on the V-shaped bottom of the epitaxial layer 212 to form a fin structure 216, as shown in FIG. 2D. The semiconductor layer 214 may include silicon, silicon germanium, compound semiconductor materials, or various other III-V materials. The semiconductor layer 214 may be grown epitaxially from the V-shaped bottom away from the epitaxial layer 212. Particularly, the semiconductor layer 214 is grown defect free because the crystal defects are terminated within the V-shaped bottom of the epitaxial layer 212. Therefore, the semiconductor layer 214 grows without any defects since any defects of the semiconductor layer 214 are localized adjacent the V-shaped bottom of the epitaxial layer 212.

The semiconductor layer 214 may be grown beyond a top surface 218 of the dielectric layer 204. Thereafter, a CMP process may be performed to remove the excess semiconductor layer 214 so that the fin structure 216 is substantially co-planar at the top surface 218 with the dielectric layer 204. The resulting fin structure 216 may have a width of less than 10 nm, for example about 7 nm, and an aspect ratio of the fin structure 216 is between about 5:1 and about 30:1. The fin structure 216 may be part of a FinFET structure formed on the substrate 200. Alternatively, the fin structure 216 may be part of a source/drain.

The V-shape formation method described in this disclosure is also applicable to application source/drain extension, source/drain formation, or III-V buffer layers.

Benefits of the present disclosure include a defect free growth of epitaxial film by pre-treating a silicon surface within a trench to an antimony-containing precursor before and/or during an epitaxial process for changing growth rate on different crystal planes so that the epitaxial film is grown into a V-shaped structure having an exposed (111) plane at the bottom of the trench. Having the epitaxial film grown into a V-shaped structure having an exposed (111) plane at the bottom of the trench help confine the crystal defects to the bottom of the trench because the V-shaped bottom changes the defect propagating angle from <100> direction to <111> direction. Since crystal defects such as stacking faults or thread dislocations are terminated at the bottom of the V or at the trench sidewall and no defects are propagating towards the upper portion of the trench, any subsequent material formed on the V-shaped bottom will be defect free.

While the foregoing is directed to implementations of the present disclosure, other and further implementations of the disclosure may be devised without departing from the basic scope thereof.

The invention claimed is:

1. A method of processing a substrate in an epitaxy chamber, comprising:
applying a passivating agent containing antimony to portions of a silicon substrate exposed through trenches formed in a dielectric layer on the silicon substrate;
while applying the passivating agent containing antimony, exposing the silicon substrate to a group IV-containing precursor to form an epitaxial layer having a V-shaped structure having an exposed (111) plane at a bottom of the trenches; and
forming a semiconductor layer on the epitaxial layer.

2. The method of claim 1, wherein a molar ratio of the passivating agent containing antimony to the group IV-containing precursor is about 0.0001 to about 10.

3. The method of claim 1, wherein the passivating agent containing antimony is an antimony-containing precursor comprising stibine ($SbH_3$), antimony trichloride ($SbCl_3$), antimony tetrachloride ($SbCl_4$), antimony pentachloride ($SbCl_5$), triphenylantimony (($C_6H_5$)$_3$Sb), antimony trihydide ($SbH_3$), antimonytrioxide ($Sb_2O_3$), antimony pentoxide ($Sb_2O_5$), antimony trifluoride ($SbF_3$), antimony tribromide ($SbBr_3$), antimonytriiodide ($SbI_3$), antimony pentafluoride ($SbF_5$), Triethyl antimony (TESb), or trimethyl antimony (TMSb).

4. The method of claim 1, wherein the group IV-containing precursor is a silicon-containing precursor comprising silanes, halogenated silanes, organosilanes, or combinations thereof.

5. A method of processing a substrate in a processing chamber, comprising:
forming a dielectric layer on a substrate;
etching the dielectric layer to form a trench, wherein the trench has a bottom surface exposing a portion of the substrate;
exposing the bottom surface to a passivating agent containing antimony;
exposing the bottom surface to a material forming precursor to form an epitaxial layer on the bottom surface, wherein the epitaxial layer has a V-shaped structure having an exposed (111) plane; and
forming a semiconductor layer on the epitaxial layer.

6. The method of claim 5, wherein the passivating agent containing antimony is an antimony-containing precursor comprising stibine ($SbH_3$), antimony trichloride ($SbCl_3$), antimony tetrachloride ($SbCl_4$), antimony pentachloride ($SbCl_5$), triphenylantimony (($C_6H_5$)$_3$Sb), antimony trihydide ($SbH_3$), antimonytrioxide ($Sb_2O_3$), antimony pentoxide ($Sb_2O_5$), antimony trifluoride ($SbF_3$), antimony tribromide ($SbBr_3$), antimonytriiodide ($SbI_3$), antimony pentafluoride ($SbF_5$), Triethyl antimony (TESb), or trimethyl antimony (TMSb).

7. The method of claim 5, wherein the epitaxial layer comprises doped or undoped group IV-containing material.

8. The method of claim 7, wherein the epitaxial layer comprises silicon.

9. The method of claim 7, wherein the epitaxial layer comprises silicon germanium.

10. The method of claim 5, wherein the material forming precursor is a silicon-containing precursor comprising silane ($SiH_4$), disilane ($Si_2H_6$), trisilane ($Si_3H_8$), tetrasilane ($Si_4H_{10}$), a polychlorosilane silane, an halogenated silane, an organosilane, or combinations thereof.

11. The method of claim 10, wherein the halogenated silane is hexachlorodisilane ($Si_2Cl_6$), tetrachlorosilane ($SiCl_4$), dichlorosilane ($Cl_2SiH_2$) or trichlorosilane ($Cl_3SiH$).

12. The method of claim 5, wherein the passivating agent containing antimony is introduced into the processing chamber as a single pulse before the introduction of the material forming precursor.

13. The method of claim 5, wherein the passivating agent containing antimony is introduced into the processing chamber as a single pulse before the introduction of the material forming precursor, and while flowing the material forming precursor into the processing chamber, introducing multiple pulses of the passivating agent containing antimony into the processing chamber at predetermined time intervals.

14. The method of claim 5, wherein the passivating agent containing antimony is introduced into the processing chamber as a single pulse before the introduction of the material forming precursor, and while flowing the passivating agent containing antimony, introducing the material forming precursor into the processing chamber.

15. The method of claim 5, wherein a molar ratio of the passivating agent containing antimony to the material forming precursor is about 0.0001 to about 10.

16. A method of processing a substrate in a processing chamber, comprising:
applying a passivating agent containing antimony to portions of a silicon substrate exposed through trenches formed in a dielectric layer on the silicon substrate;
exposing the portions of the silicon substrate to a material forming precursor to form an epitaxial layer having a V-shaped structure having an exposed (111) plane at a bottom of the trenches, wherein the passivating agent containing antimony is introduced into the processing chamber before the introduction of the material forming precursor such that growth rate of the epitaxial layer on {111} planes of the exposed portion of the silicon substrate is faster than growth rate of the epitaxial layer on {100} planes of the exposed portion of the silicon substrate; and
forming a semiconductor layer on the epitaxial layer.

17. The method of claim 16, wherein the passivating agent containing antimony is an antimony-containing precursor comprising stibine ($SbH_3$), antimony trichloride ($SbCl_3$), antimony tetrachloride ($SbCl_4$), antimony pentachloride ($SbCl_5$), triphenylantimony (($C_6H_5)_3Sb$), antimony trihydide ($SbH_3$), antimonytrioxide ($Sb_2O_3$), antimony pentoxide ($Sb_2O_5$), antimony trifluoride ($SbF_3$), antimony tribromide ($SbBr_3$), antimonytriiodide ($SbI_3$), antimony pentafluoride ($SbF_5$), Triethyl antimony (TESb), or trimethyl antimony (TMSb).

18. The method of claim 16, wherein the material forming precursor is a silicon-containing precursor comprising silane ($SiH_4$), disilane ($Si_2H_6$), trisilane ($Si_3H_8$), tetrasilane ($Si_4H_{10}$), a polychlorosilane silane, an halogenated silane, an organosilane, or combinations thereof.

19. The method of claim 16, wherein a molar ratio of the passivating agent containing antimony to the material forming precursor is about 0.0001 to about 10.

* * * * *

UNITED STATES PATENT AND TRADEMARK OFFICE
CERTIFICATE OF CORRECTION

PATENT NO. : 10,002,759 B2
APPLICATION NO. : 15/417556
DATED : June 19, 2018
INVENTOR(S) : Xinyu Bao et al.

Page 1 of 1

It is certified that error appears in the above-identified patent and that said Letters Patent is hereby corrected as shown below:

In the Specification

In Column 4, Line 21, delete "trihydide" and insert -- trihydride --, therefor.

In the Claims

In Column 8, Lines 12-13, in Claim 3, delete "trihydide" and insert -- trihydride --, therefor.

In Column 8, Lines 39-40, in Claim 6, delete "trihydide" and insert -- trihydride --, therefor.

In Column 10, Lines 10-11, in Claim 17, delete "trihydide" and insert -- trihydride --, therefor.

Signed and Sealed this
Twenty-eighth Day of May, 2019

Andrei Iancu
*Director of the United States Patent and Trademark Office*